(12) United States Patent
Kudo et al.

(10) Patent No.: US 6,970,052 B2
(45) Date of Patent: Nov. 29, 2005

(54) MODULATOR IMMUNE FROM TEMPERATURE VARIATION-INDUCED CHANGE IN MODULATION FACTOR

(75) Inventors: Yasuharu Kudo, Fukushima-ken (JP); Etsuya Shibata, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 841 days.

(21) Appl. No.: 09/978,739

(22) Filed: Oct. 16, 2001

(65) Prior Publication Data
US 2002/0047940 A1   Apr. 25, 2002

(30) Foreign Application Priority Data
Oct. 19, 2000   (JP) ............................. 2000-324687

(51) Int. Cl.[7] ............................................. H03C 3/02
(52) U.S. Cl. ..................... 332/123; 332/107; 332/124; 348/680; 348/682; 348/695; 348/723; 348/724
(58) Field of Search ................................ 332/123, 125, 332/107; 348/682, 680, 695, 723, 724

(56) References Cited

U.S. PATENT DOCUMENTS 4,695,886 A * 9/1987 Schofield .................... 348/682
5,282,076 A   1/1994 Banks

FOREIGN PATENT DOCUMENTS

JP    HEI 10-341112    12/1998

* cited by examiner

Primary Examiner—Arnold Kinkead
(74) Attorney, Agent, or Firm—Brinks Hofer Gilson & Lione

(57) ABSTRACT

A modulation factor is kept immune from the influence of temperature variation. A modulator is provided with an operational amplifier to one of whose input ends are inputted video signals and to the other is applied a reference voltage and a video mixer into which are entered carrier wave signals and video signals amplified by the operational amplifier, wherein the reference voltage is raised or lowered as the gain of the video mixer increases or decreases, respectively, with a variation in temperature.

1 Claim, 3 Drawing Sheets

MODULATOR IMMUNE FROM TEMPERATURE VARIATION-INDUCED CHANGE IN MODULATION FACTOR

This application claims the benefit of priority to Japanese Patent Application 2000-324687, filed on Oct. 19, 2000.

BACKGROUND OF THE INVENTION

1. Field of the Invention

The present invention relates to a modulator for use in television signal transmitters and the like.

2. Description of the Prior Art

A television signal transmitter for use in CATV systems and the like uses a modulator for modulating a carrier wave with video signals to obtain intermediate frequency signals of the PAL specification (European specification) in the 30 MHz band or the NTSC specification (U.S. specification) in the 40 MHz band.

FIG. 4 illustrates the configuration of such a modulator according to the prior art. Video signals Vd serving as modulation signals are inputted to the inverted input end (−) of an operational amplifier 31, and to its non-inverted input end (+) is applied a reference voltage Er.

As a video mixer 32 consists of a double-balance mixer having a first differential amplifier 32a and a second differential amplifier 32b each having two transistors, emitters of a first transistor TR1 and a second transistor TR2 in the first differential amplifier 32a are connected to each other, and those of a third transistor TR3 and a fourth transistor TR4 in the second differential amplifier 32b are also connected to each other. An output end of the operational amplifier 31 is connected to the emitters of the first and second transistors TR1 and TR2.

Bases of the first transistor TR1 and the fourth transistor TR4 are connected to each other, and those of the second transistor TR2 and the third transistor TR3 are also connected to each other. Further, collectors of the first transistor TR1 and the third transistor TR3 are connected to each other, and those of the second transistor TR2 and the fourth transistor TR4 are also connected to each other.

The emitters of the first and second transistors TR1 and TR2 are grounded via a resistor 33, and those of the third and fourth transistors TR3 and TR4 are grounded via a resistor 34.

Further, the collectors of the first and third transistors TR1 and TR3 and those of the second and fourth transistors TR2 and TR4 are connected to a terminal on one side of a balanced-to-unbalanced transformer 35, whose terminal on the other side is connected to a power supply terminal 37 via a choke inductor 36, and the other terminal on the other side is grounded on a high frequency basis by a capacitor 38.

Between the connection point of the balanced-to-unbalanced transformer 35 and the choke inductor 36 and an output end 39 is connected a resistance attenuator 40 in a π pattern.

A carrier wave signal Cw is entered into a balanced amplifier 43 via a resistance attenuator 41 and a balanced-to-unbalanced transformer 42 configured in a π pattern, amplified and entered in a balanced way between the bases of the first and fourth transistors TR1 and TR4 and those of the second and third transistors TR2 and TR3.

In the configuration described above, the video mixer 32 operates in an unbalanced input pattern with respect to video signals and in a balanced input pattern with respect to carrier wave signals. From the output end 39, a signal whose waveform is modulated as shown in FIG. 5A, i.e. a compound picture signal is supplied, whose modulation factor (M/C) is set by the reference voltage Er of the operational amplifier 31.

However, as the currents of the transistors in the double-balance mixer 32 vary with the ambient temperature, their gains also vary, and eventually the modulation factor varies, too.

If, for instance, a variation in temperature increases the transistor currents and their gains also rise, the amplitude of the compound video signal expands from M to M' as its waveform shown in FIG. 5B indicates. On the other hand, as the reference voltage Er is constant at the minimum level E of the picture signal, the modulation factor M'/C' varies in an increasing direction from before the temperature variation.

SUMMARY OF THE INVENTION

An object of the present invention, therefore, is to provide a modulator whose modulation factor is kept immune by the influence of temperature variations.

To achieve this object, a modulator according to the invention is provided with an operational amplifier to one of whose input ends are inputted video signals and to the other is applied a reference voltage and a video mixer into which are entered carrier wave signals and video signals amplified by the operational amplifier, wherein the reference voltage is raised or lowered as the gain of the video mixer increases or decreases, respectively, with a variation in temperature.

The video mixer may be configured of a double-balance mixer consisting of a first differential amplifier and a second differential amplifier each having two transistors, wherein the video signals amplified by the operational amplifier are entered into emitters of the transistors of the first differential amplifier, wherein the carrier wave signals are entered between bases of the two transistors of the first differential amplifier and between bases of the two transistors of the second differential amplifier, and wherein voltages of the emitters of the transistors of the second differential amplifier are superposed over the reference voltage.

DESCRIPTION OF THE PREFERRED EMBODIMENTS OF THE INVENTION

Figure 1:
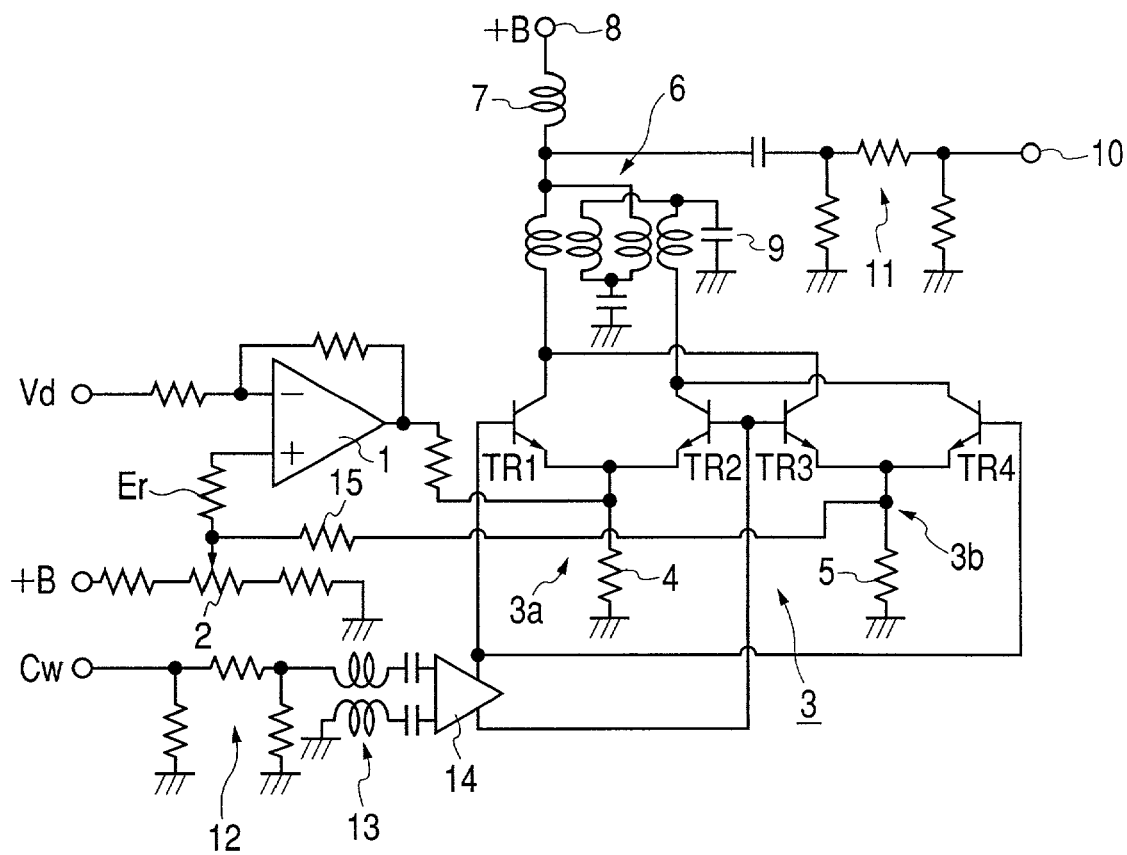
FIG. 1 is a circuit diagram showing the configuration of the modulator according to the present invention.

FIG. 1 illustrates the configuration of a modulator according to the present invention. A video signal Vd as a modulation signal is inputted to the inverted input end (−) of the operational amplifier 1 and a reference voltage Er is applied to its non-inverted input end (+). This reference voltage Er is obtained by dividing a source voltage +B with a variable resistor 2.

As a video mixer 3 into which video signals are entered is configured of a double-balance mixer consisting of a first differential amplifier 3a and a second differential amplifier 3b each having two transistors, emitters of the first transistor TR1 and the second transistor TR2 in the first differential amplifier 3a are connected to each other, and emitters of the first transistor TR1 and the second transistor TR2 in the third transistor TR3 and the fourth transistor TR4 are also connected to each other. The emitters of the first and second transistors TR1 and TR2 are grounded via a resistor 4, and the emitters of the third and fourth transistors TR3 and TR4 are grounded via a resistor 5.

To extract compound picture signals containing the carrier wave from the video mixer 3, video signals amplified by the operational amplifier 1 are entered only into the emitters of the first and second transistors TR1 and TR2 of the first differential amplifier 3a. Voltages emerging at the emitters of the third and fourth transistors TR3 and TR4 of the second differential amplifier 3b are superposed over the reference voltage Er obtained by voltage division by the variable resistor 2.

Bases of the first transistor TR1 and the fourth transistor TR4 are connected to each other, and those of the second transistor TR2 and the third transistor TR3 are also connected to each other. Further, collectors of the first transistor TR1 and the third transistor TR3 are connected to each other, and those of the second transistor TR2 and the fourth transistor TR4 are also connected to each other.

The collectors of the first and third transistors TR1 and TR3 and those of the second and fourth transistors TR2 and TR4 are connected to two terminals on one side of a balanced-to-unbalanced transformer 6. One of the terminals on the other side is connected to a power supply terminal 8 via a choke inductor 7. To the power supply terminal 8 is applied a source voltage +B. The other terminal on the other side is grounded on a high frequency basis by a grounding capacitor 9.

Between the connection point between the balanced-to-unbalanced transformer 6 and the choke inductor 7 and an output end 10 is connected a resistance attenuator 11 connected in a π pattern.

The carrier wave signal Cw is entered into a balanced amplifier 14 via a resistance attenuator 12 and a balanced-to-unbalanced transformer 13 configured in a π pattern, and the amplified carrier wave signal is entered between the bases of the first and fourth transistors TR1 and TR4 and those of the second and third transistors TR2 and TR3 in a balanced pattern.

Figure 2:
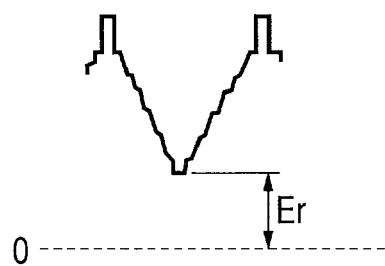
FIG. 2 is an output waveform diagram of the operational amplifier in the modulator according to the invention.

In the configuration described above, a video signal amplified by the operational amplifier 1 takes on the waveform shown in FIG. 2, and its level rises or drops as the reference voltage Er is varied. When a carrier wave signal is modulated with the video signal, a modulated signal having the waveform shown in FIG. 3A, i.e. a compound picture signal, emerges at the output end 10, and its modulation factor (M/C) is set to a prescribed level by the reference voltage Er of the operational amplifier 1.

Figure 3:
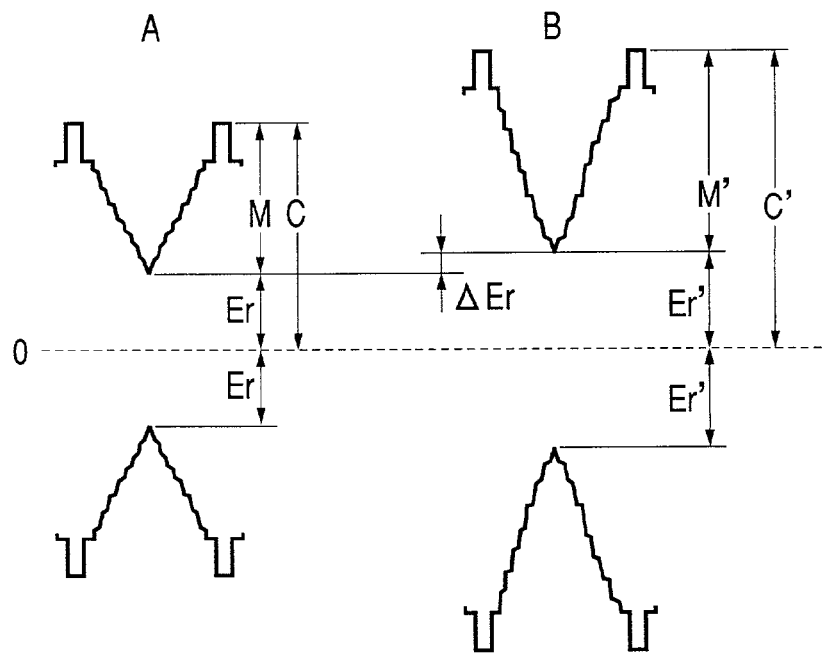
FIG. 3 is a waveform diagram to aid the description of the modulation factor of the modulator according to the invention.
Figure 4:
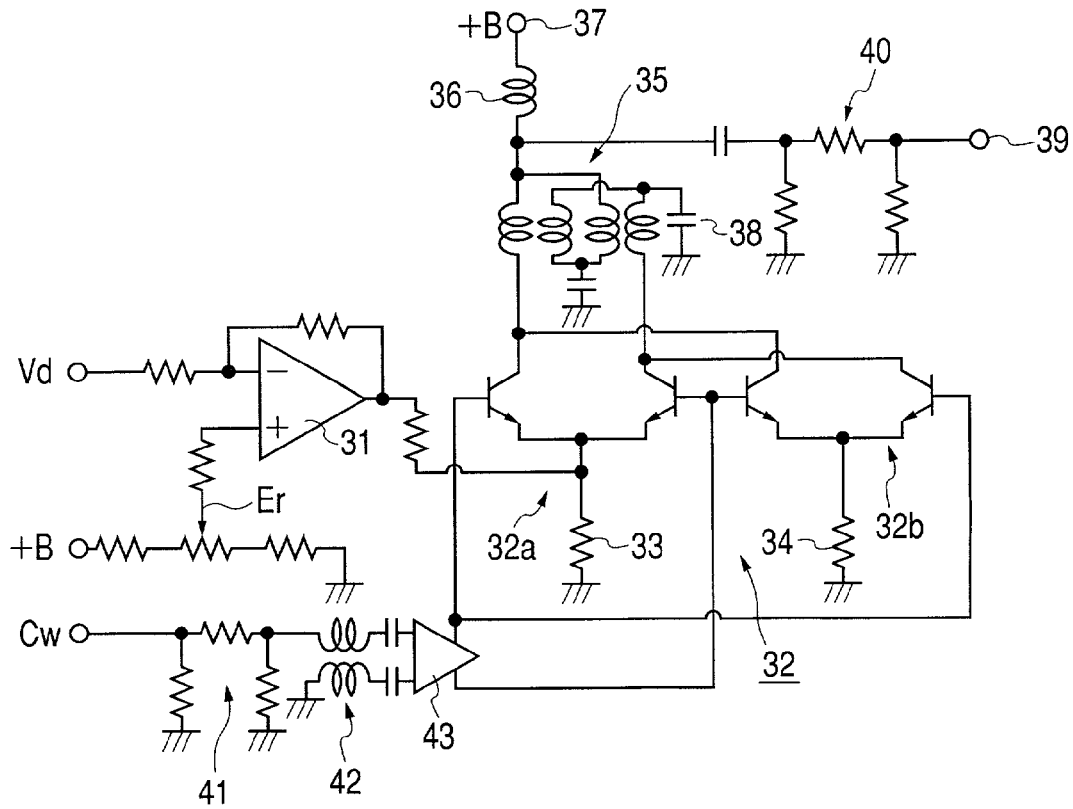
FIG. 4 is a circuit diagram showing the configuration of a modulator according to the prior art.
Figure 5:
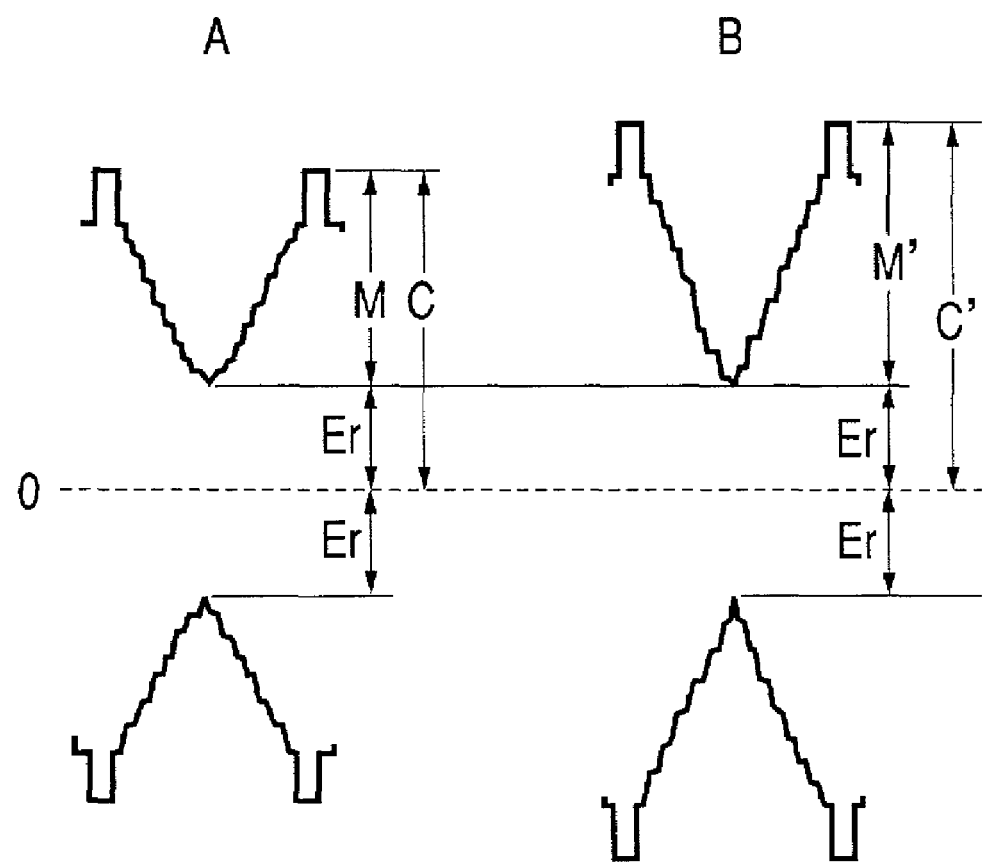
FIG. 5 is a waveform diagram to aid the description of the modulation factor of the modulator according to the prior art.

Now, if the currents of the transistors TR1 through TR4 in the video mixer 3 are increased by a temperature variation, resulting in increased gains for instance, the amplitude of the video signal in the waveform of the modulated signal expands from M to M' as shown in FIG. 3B.

However, as the temperature variation raises the currents of the transistors, the emitter voltages of the third and fourth transistors TR3 and TR4 in the second differential amplifier 3b rise, and the raised voltages are superposed over the reference voltage Er, with the result that the actual reference voltage Er' applied to the non-inverted input end (+) of the operational amplifier 3 becomes higher than Er by ΔEr. By setting this augmented reference voltage Er' in advance to be M'/M times Er, the modulation factor M'/C" will remain unchanged.

This setting can be readily accomplished by setting the resistance of a resistor 15 for superposing the emitter voltages of the third and fourth transistors TR3 and TR4 or that of a voltage divider (the variable resistor 2 or the like) for obtaining the reference voltage Er.

As hitherto described, since the modulator according to the present invention is provided with an operational amplifier to one of whose input ends are inputted video signals and to the other is applied a reference voltage and a video mixer into which are entered carrier wave signals and video signals amplified by the operational amplifier, wherein the reference voltage is raised or lowered as the gain of the video mixer increases or decreases, respectively, with a variation in temperature, it can keep the modulation factor immune from the influence of temperature variations.

Also, the video mixer may be configured of a double-balance mixer consisting of a first differential amplifier and a second differential amplifier each having two transistors, wherein the video signals amplified by the operational amplifier are entered into the emitters of the transistors of the first differential amplifier, wherein the carrier wave signals are entered between the bases of the two transistors of the first differential amplifier and between the bases of the two transistors of the second differential amplifier, and wherein the voltages of the emitters of the transistors of the second differential amplifier are superposed over the reference voltage. Accordingly, even if the currents of the transistors are varied by a temperature change, the emitter voltages at the time are automatically superposed over the reference voltage to keep the modulation factor from varying.

What is claimed is:

1. A modulator comprising:
    an operational amplifier to one of whose input ends are inputted video signals and to another of the input ends is applied a reference voltage; and
    a video mixer into which carrier wave signals and video signals amplified by the operational amplifier are applied,
    wherein the reference voltage is varied in accordance with a gain of the video mixer with a variation in temperature,
    the video mixer comprises: a double-balance mixer including a first differential amplifier and a second differential amplifier each having two transistors,
    the video signals amplified by the operational amplifier are applied to emitters of the transistors of the first differential amplifier,
    the carrier wave signals are applied to bases of the two transistors of the first differential amplifier and to bases of the two transistors of the second differential amplifier, and
    voltages of the emitters of the transistors of the second differential amplifier are superposed over the reference voltage.

* * * * *